United States Patent
Peng et al.

(10) Patent No.: US 10,274,536 B2
(45) Date of Patent: Apr. 30, 2019

(54) TIME TO CURRENT CONVERTER

(71) Applicant: Taiwan Semiconductor Manufacturing Company Limited, Hsinchu (TW)

(72) Inventors: Yung-Chow Peng, Hsinchu (TW); Po-Zeng Kang, Tainan (TW); Wen-Shen Chou, Hsinchu County (TW); Yu-Tao Yang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 178 days.

(21) Appl. No.: 15/223,033

(22) Filed: Jul. 29, 2016

(65) Prior Publication Data

US 2018/0031627 A1 Feb. 1, 2018

(51) Int. Cl.
  *G01R 31/28* (2006.01)
(52) U.S. Cl.
  CPC ................. *G01R 31/2882* (2013.01)
(58) Field of Classification Search
  CPC .......... G01R 31/2882; G01R 31/31727; G01R 31/31718
  See application file for complete search history.

(56) References Cited

U.S. PATENT DOCUMENTS

| 5,773,985 | A * | 6/1998 | Bradley | G01R 27/28 324/638 |
| 9,853,611 | B2 * | 12/2017 | Chang | H03F 1/34 |
| 2006/0082935 | A1 * | 4/2006 | Lai | H02J 7/022 361/18 |
| 2007/0091524 | A1 * | 4/2007 | Davis | H01L 27/0285 361/56 |
| 2011/0061031 | A1 * | 3/2011 | Hsu | G06F 17/5063 716/51 |
| 2013/0049810 | A1 * | 2/2013 | Lu | H03K 5/131 327/43 |
| 2015/0256164 | A1 * | 9/2015 | Ebato | H03K 5/13 327/115 |
| 2016/0018447 | A1 * | 1/2016 | Nys | H03M 3/414 324/76.24 |
| 2016/0142058 | A1 * | 5/2016 | Lee | H03K 5/135 327/145 |
| 2016/0204881 | A1 * | 7/2016 | Chung | H04B 17/00 455/67.14 |
| 2016/0365846 | A1 * | 12/2016 | Wyland | G01S 17/105 |

* cited by examiner

*Primary Examiner* — Huy Q Phan
*Assistant Examiner* — Zannatul Ferdous
(74) *Attorney, Agent, or Firm* — Jones Day

(57) ABSTRACT

A device comprising a device under test and a time to current converter configured to be coupled to the device under test. The device under test comprises: (i) at least one delay element for creating a delay; (ii) at least one capacitor for providing capacitance loading to the at least one delay element; and (iii) at least one switch to control the capacitance loading provided by the at least one capacitor. The time to current converter comprises (i) a first input for receiving a first clock signal; (ii) a second input for receiving an inverted and delayed version of the first clock signal from the device under test; and (iii) an impedance module for measuring an output current. During a testing mode, the at least one switch is in a closed position so the at least one capacitor can provide a capacitance loading to the at least one delay element to amplify the delay associated with the device under test.

20 Claims, 6 Drawing Sheets

TIME TO CURRENT CONVERTER

TECHNICAL FIELD

This relates to a time to current converter and more particularly to devices and method for time to current conversion which may be used in an aging sensor to identify process variation and/or device aging.

BACKGROUND

The measurement of timing information is a common requirement for integrated circuit devices. This information may include jitter, duty cycle, pulse width, frequency, signal delays, etc. In particular, accurate measurements concerning this information may be important for certain integrated circuit devices. On chip timing measurement is an important technique used for integrated circuits such as systems on chip (SoC) because internal nodes within the SoC may be difficult to access and performing time interval measurements using automatic test equipment can be expensive.

In certain integrated circuits, signal delay may be of particular interest. Known methods and devices for measuring signal delay may suffer from one or more drawbacks. For example, some devices for measuring signal delay may have a low measurement resolution; may have an insufficient timing range; and/or may not be able to measure small spans of time. Some devices may require a complicated calibration process. Additionally, some device may occupy a significant amount of area on the integrated circuit device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
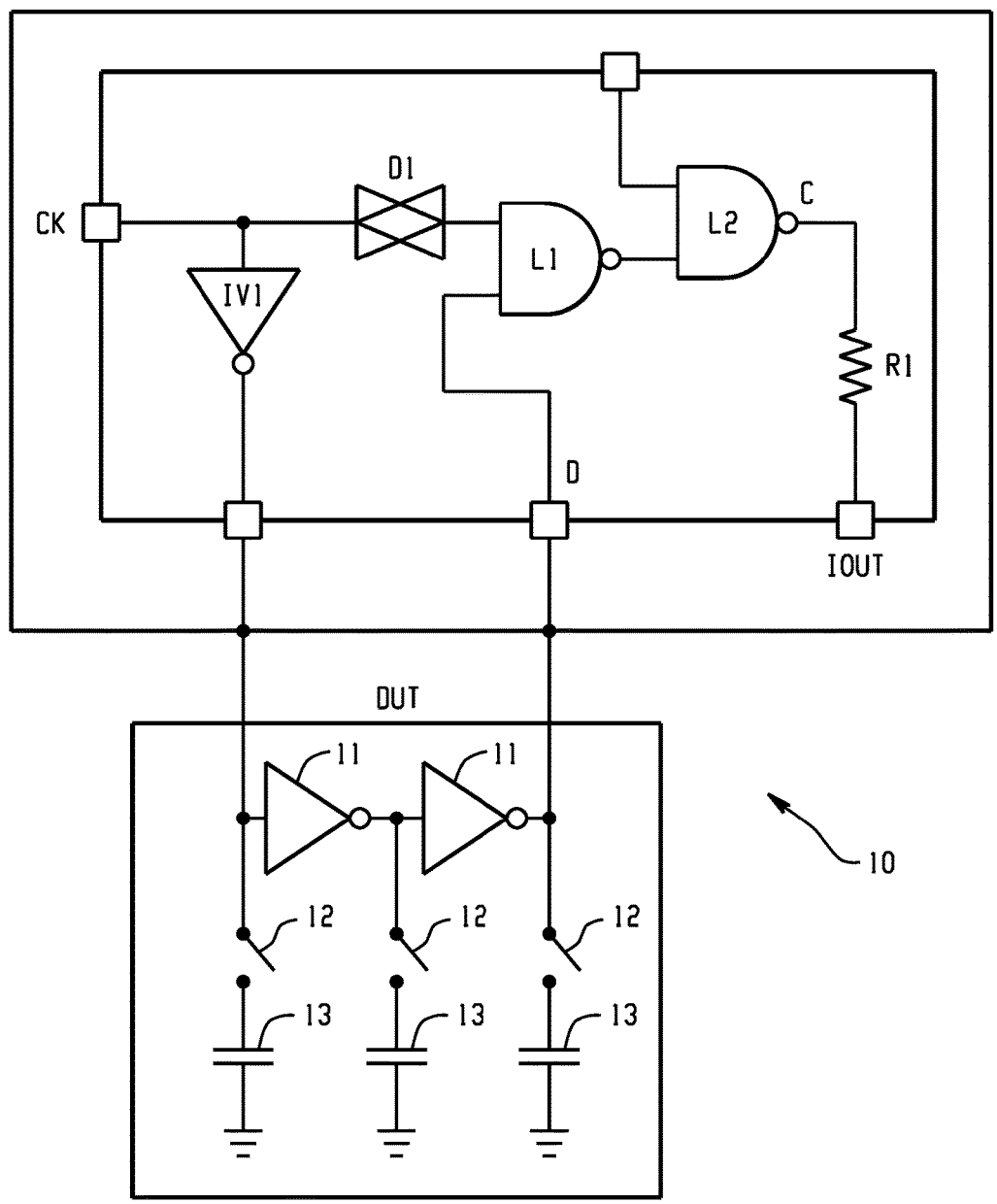
FIG. 1 is a schematic drawing of an example of a time to current converter in a first mode of operation, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a time to current converter that may address one or more disadvantages of existing time to current converters. In some embodiments, the time to current converter may use time amplification to obtain delay information. In some embodiments, the time to current converter may be utilized as an aging sensor to identify process variation and/or device aging.

Figure 2:
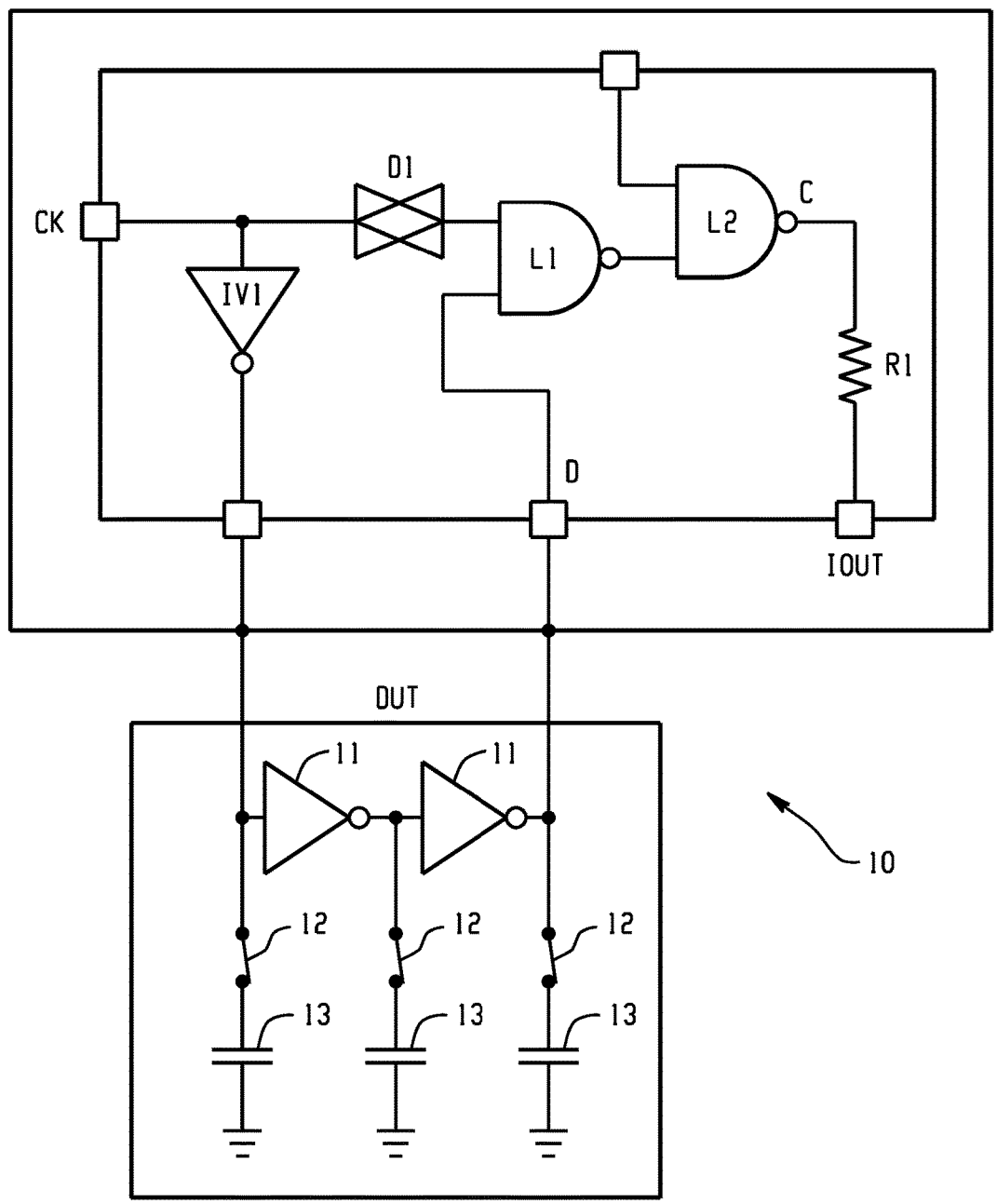
FIG. 2 is a schematic drawing of an example of a time to current converter in a second mode of operation, in accordance with some embodiments.

FIG. 1 is a schematic drawing of an example of a time to current converter in a first mode of operation and FIG. 2 is a schematic drawing of an example of a time to current converter in a second mode of operation, in accordance with some embodiments. The time to current converter 10 may be formed on an integrated circuit, such as an SoC, with a circuit or device under test such as the device under test ("DUT") in FIG. 1. In alternative embodiments, the time to current converter 10 may be part of a tester or separate test circuit.

FIG. 1 and FIG. 2, differ from on another in that the switches 12 are open in FIG. 1 and the switches 12 are closed in FIG. 2. The open switch position corresponds to the first mode of operation for the time to current converter 10 and the device under test DUT—a normal mode of operation. The closed switch position corresponds to the second mode of operation for the time to current converter 10 and the device under test DUT—a test mode of operation. In operation, the DUT is a circuit that adds delay to an incoming signal. As explained in more detail below, the delay of the device under test DUT is amplified when the switches 12 are closed. In some embodiments, it may be desirable to know the amount of delay added by the DUT. To determine the value of the delay, time to current converter 10 may be used. As illustrated, a clock or known periodic signal is coupled to the input CK and then coupled to the input of the DUT through an inverter IV1, and the signal CK is also input to a logic gate L1 using a matched delay D1. The delay D1 matches the delay through the inverter IV1. Thus, the two signals, the clock input received through the matched delay D1 and the delayed signal D received through the DUT, arrive at the inputs of the logic gate L1 with the delay through the DUT being the only delay affecting the timing of the two signals. In other words, the effect of the delay introduced by IV1 and D1 cancel each other out. For example, if the DUT delay is zero, the signals would arrive at the gate L1 at the same time (i.e., with the same delay). In FIG. 1 and FIG. 2, the logic gate L1 is a NAND function, so that it will output a logic "0" when the signals at the inputs to the logic gate L1 are both a logic "1". Otherwise, the logic gate L1 outputs a logic "1". In this way, the logic gate L1 detects when the two signals, the clock signal CK, and the delayed signal D from the DUT device, overlap in time.

A second logic gate L2 receives the output of gate L1 and logically combines this with a test input labeled "Test DC" and outputs a voltage at node "C". As this gate is also a logic NAND gate, it will output a high voltage or logic "1" when either input is a "0", and it will output a logic "0" or low voltage when both inputs are logic "1" or high voltage levels.

As a result of this structure, the time to current circuit 10 illustrated in FIG. 1 may operate in accordance with the following mathematical relationship:

$$Td = \frac{Iavg \times Tck}{Idc}$$

where, Td is the time delay introduced by the device under test DUT; Iavg, is the average current measured at node "C"; Tck is the period of the CK signal; and Idc is a DC current value.

In the time to current converter operation, two measurements are made. When the input Test DC is logic "0", the NAND gate L2 always outputs a logic "1" output at node "C". As this logic "1" is typically a high voltage, this provides a DC voltage (over a given time period, it can be maintained as a DC voltage indefinitely using the Test DC input) to the impedance, and the current flowing through the impedance, here a resistor R1, is a DC current. This current may be measured at the IOUT terminal and is equal to the DC current (Idc). Thus, by using the input Test DC to cause L2 to output a high voltage at node "C" over a period, the average DC current Idc may be measured at the output IOUT.

When the test input Test DC is a logic "1", then the output "C" is determined by the output of logic gate L1, and the output of L2 is a "1" when the output of logic gate L1 is a logic "0". That is, when the D signal (the delayed and inverted clock signal CK following the delay through the DUT) is overlapping the clock input CK at the inputs of L1, a pulse at the output of L1 will be inverted and output at node C. This pulse voltage, when taken through the impedance R1, will then form an average current that can be measured at output IOUT, and the average current Iavg forms the current that is proportional to the delay of the device under test DUT. Thus, the current Iavg is proportional to the delay of the device under test DUT; and this current can be determined when the test input Test DC is at a logic "1".

The example impedance R1 in FIG. 1 and FIG. 2 is a resistor. Resistors on board integrated circuits may be provided in a variety of ways, including but not limited to the use of diffusion resistors, polysilicon resistors, and the use of other materials that provide electrical conductivity with resistance. The physical value of the resistor R1 is not critical to the time to current measurement, only the average current measured in response to the logic circuitry output. Process dependent or temperature dependent device variations are also not critical, as they do not impact the time to current converter measurements. In alternative embodiments, other non-linear impedances may be used. RC and LC impedances may be used, for example.

As illustrated in FIG. 1 and FIG. 2, the device under test DUT comprises delay elements 11 and switched capacitor arrays 12, 13 coupled to the delay elements. In FIG. 1, the switches 12 are open and therefore the capacitors do not affect the time to current circuit 10 or the device under test DUT. That is, the delay elements 11 act like simple delay elements. And the total delay introduced by the device under test DUT is equal to the sum of the delay introduced by each element 11. However, when the switches 12 are closed, the delay of the DUT is multiplied by a factor of N, where the value of N is dependent on the size of the capacitors 13 and their corresponding charge and/or discharge times. In some embodiments, the capacitors may be varactors and/or MOSFET capacitors. In some embodiments, the switches may have small or negligible resistance so as to reduce the impact of the switch on the delay times. In some embodiments, the switch may be implemented using a pass gate. In operation, while the capacitors are charging and/or discharging, an additional delay may be introduced so the capacitor acts to amplify the delay that would be otherwise introduced by the device under test DUT.

Figure 3A:
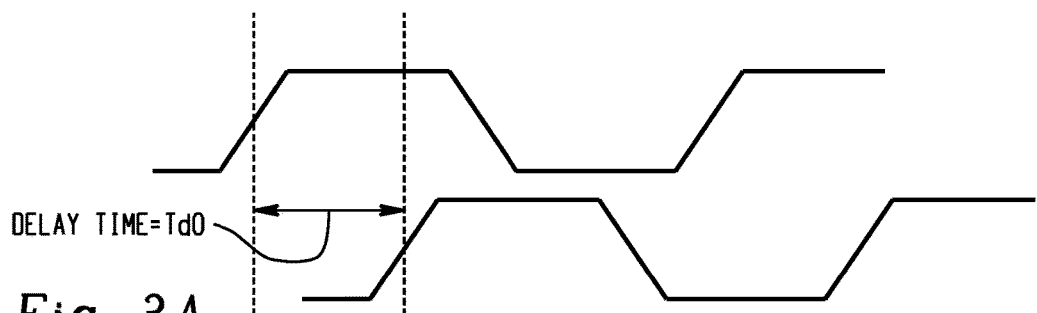
FIGS. 3A, 3B, and 3C are timing diagrams illustrating the operation of the time to current converter of FIGS. 1 and 2, in accordance with some embodiments.
Figure 3B:
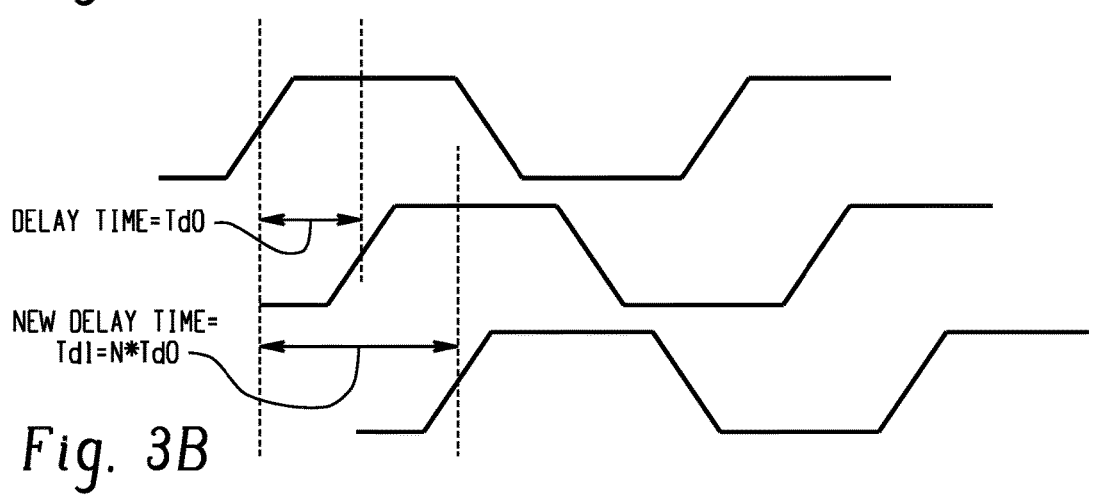
Figure 3C:
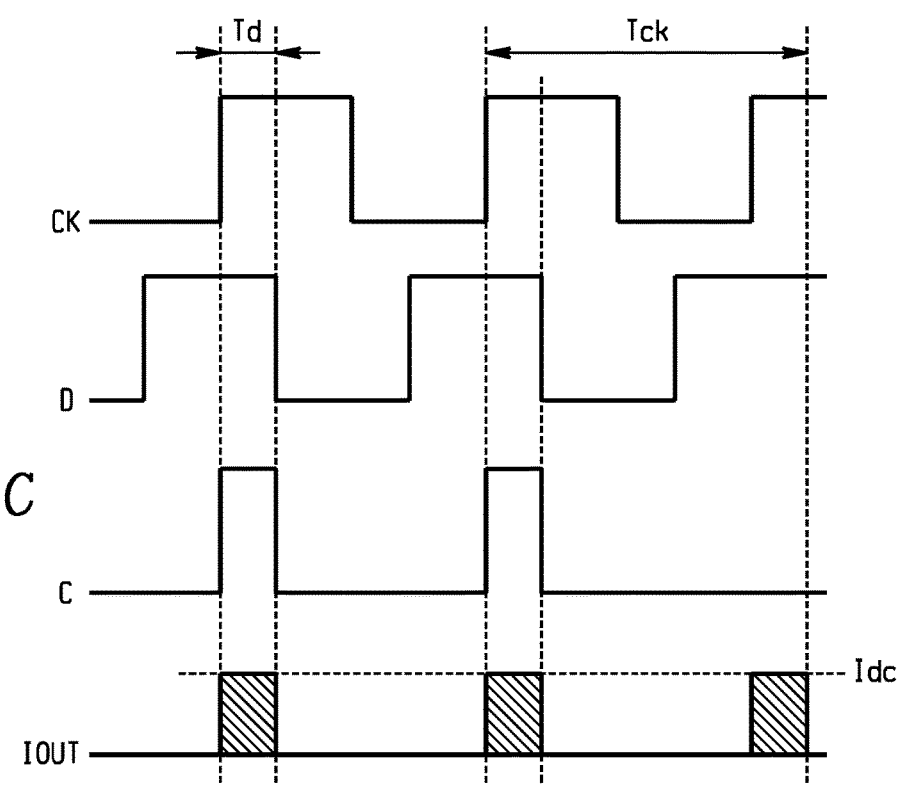

The operation of the time to current converter illustrated in FIG. 1 and FIG. 2 may be understood by viewing various timing diagrams corresponding to the operation of the device. FIGS. 3A, 3B, and 3C are timing diagrams illustrating the operation of the time to current converter of FIGS. 1 and 2 in accordance with some embodiments. FIG. 3A illustrates the time delay introduced by the device under test DUT during the first mode of operation illustrated by FIG. 1. In other words, the while the switches 12 are in the open position. In some embodiments, this may also be referred to as the normal operation mode. As illustrated, the DUT introduces a time delay of Td0. FIG. 3B illustrates the time delay introduced by the device under test DUT during the second mode of operation illustrated by FIG. 2. In other words, the while the switches 12 are in the closed position. In some embodiments, this may also be referred to as the test operation mode. As illustrated, the device under test DUT introduces a time delay of N*Td0.

The amplified delay illustrated in FIG. 3B may be desirable when the delay Td0 is small. In situations where the delay is small and approaching the resolution of the time-current converter 10, the error (e.g., uncertainty) may be large. For example, if the resolution of the time to current converter 10 is about 1 ps and the delay size is 5 ps, the error percentage may be about 20%. Relatively, this is a significant error. However, with the capacitors introducing a multiplier of N into the delay (e.g., 20 time, 50 time, 100 time, 200 time, or 250 times), a 5 ps delay may become 1000 ps (N=200). In this case, assuming the resolution of the time to current converter is still 1 ps, the error is reduced to 0.1%.

FIG. 3C is a timing diagram illustrating the overall operation of the time to current converter illustrated in FIG. 1 and FIG. 2. As illustrated, the CK signal is a time varying periodic signal with a period (Tck). The D signal is an inverted and delayed version of the CK signal. The delay is identified as Td. Assuming the Test DC signal is logic "1", the output at node C is illustrated as a series of pulses corresponding to the overlap between CK and D. Accordingly, the current has a similar pulse shape and an Iavg can be calculated. Using the mathematical relationship discussed above, the time delay (Td) can be calculated.

Figure 4:
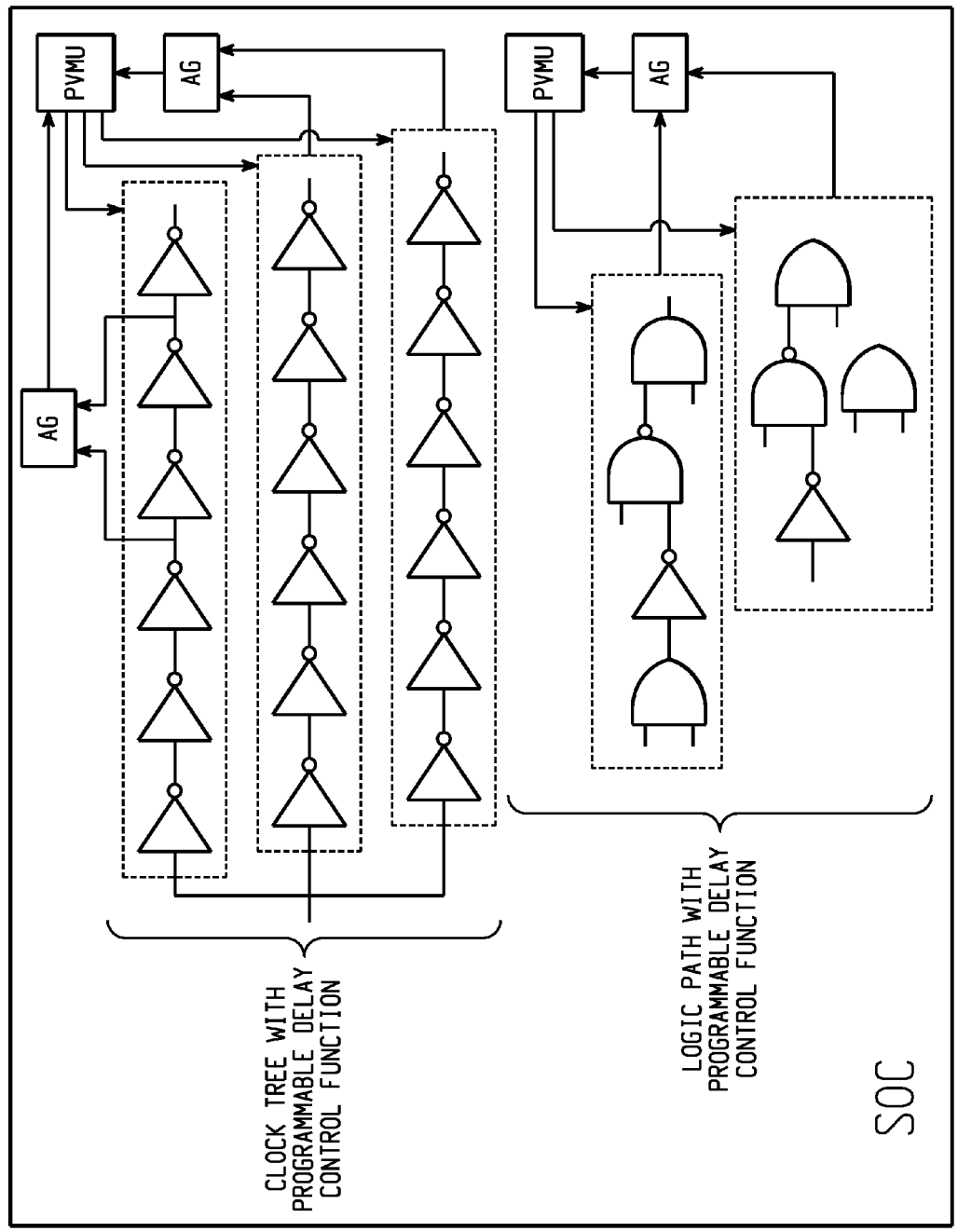
FIG. 4 is a schematic diagram illustrating the use of time to current converter in conjunction with a process variation management unit, in accordance with some embodiments.

FIG. 4 is a schematic diagram illustrating the use of time to current converter in conjunction with a process variation management unit, in accordance with some embodiments. In FIG. 4, the aging sensor (AG) corresponds to the time to current converter 10 described with respect to FIG. 1 and FIG. 2. In FIG. 4, the SoC comprises a clock tree and logic path circuit with programmable delay control functionality (e.g., a device under test DUT structure like that described in connection with FIG. 1 and FIG. 2). The aging sensor is coupled to these circuits and detects timing skew inside the clock trees and logic paths that is caused by variations of the process at the initial state. In other words, variations caused by the manufacturing process for the SoC that may be different for each SoC. The timing information is then communicated to a process variation management unit (PVMU). The PVMUs collect the timing skew information and adjust the delay times within the SoC to reduce and/or minimize process variation for the SoC.

Figure 5:
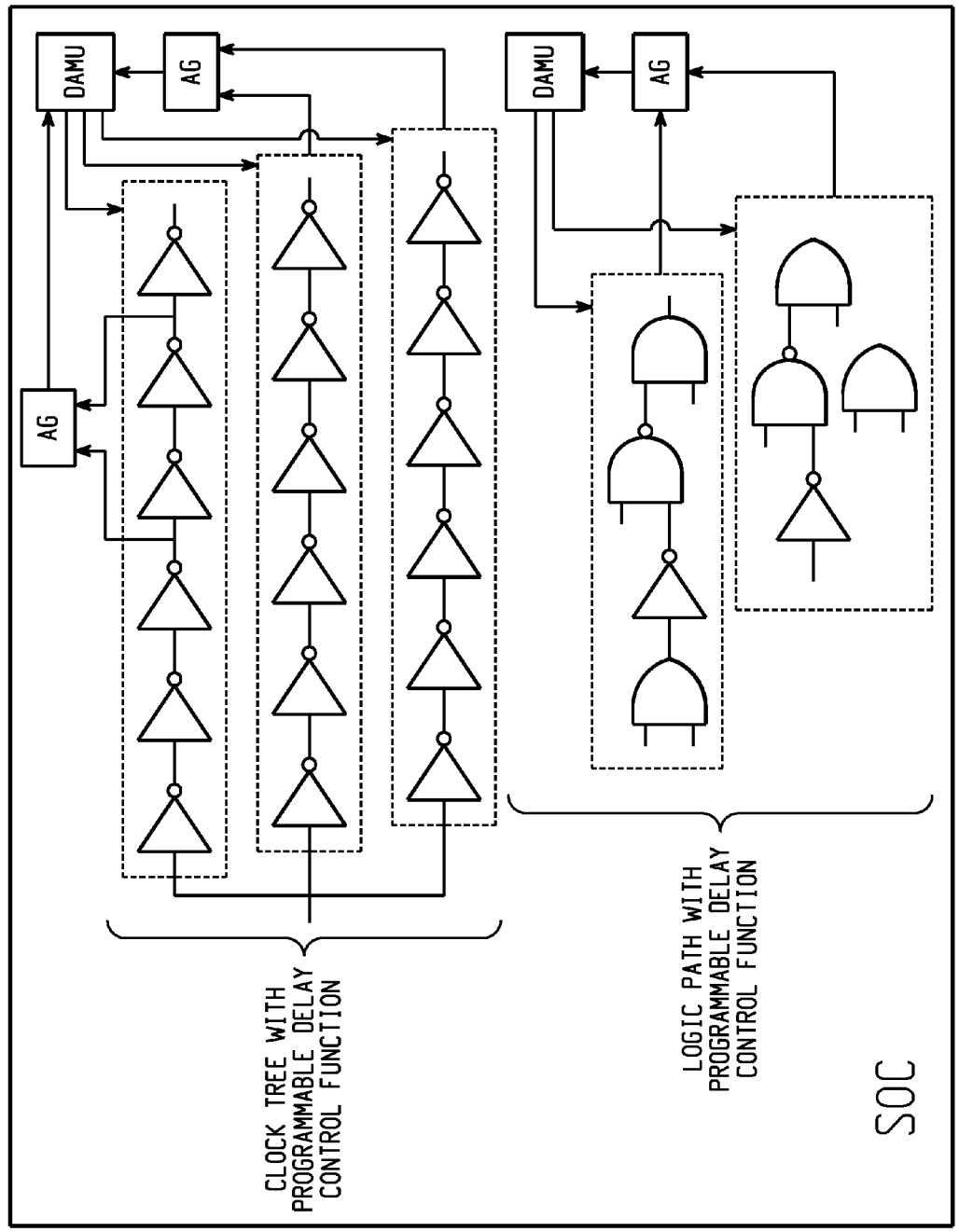
FIG. 5 is a schematic diagram illustrating the use of time to current converter in conjunction with a dynamic aging management unit, in accordance with some embodiments.

FIG. 5 is a schematic diagram illustrating the use of time to current converter in conjunction with a dynamic aging management unit, in accordance with some embodiments. In FIG. 5, the aging sensor (AG) corresponds to the time to current converter 10 described with respect to FIG. 1 and FIG. 2. In FIG. 5, like FIG. 4, the SoC comprises a clock tree and logic path circuit with programmable delay control functionality (e.g., a device under test DUT structure like that described in connection with FIG. 1 and FIG. 2). The aging sensor is coupled to these circuits and detects timing skew inside the clock trees and logic paths that is caused by device aging. In other words, dynamic variations that varies over the lifetime of the Soc. The timing information is then communicated to a dynamic aging management unit (DAMU). The DAMUs collect the timing skew information and adjust the delay times within the SoC to reduce and/or minimize the impact of aging in the device and/or variations due to power drop.

Figure 6:
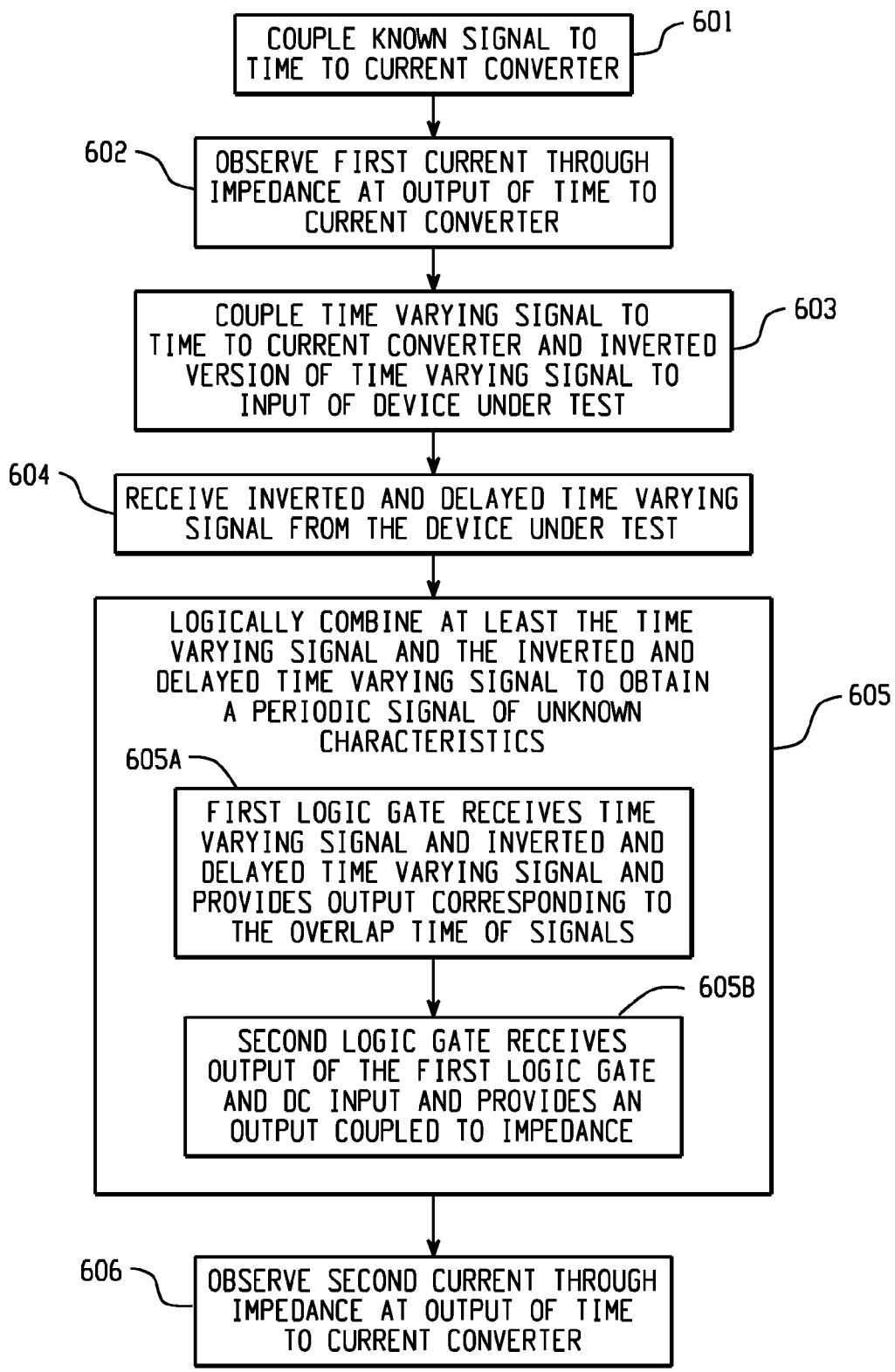
FIG. 6, is a flow chart illustrating the operation of an example of a time to current converter described herein, in accordance with some embodiments.

FIG. 6, is a flow chart illustrating the operation of an example of a time to current converter described herein in accordance with some embodiments. The operations of FIG. 6 are described with reference to structures in FIGS. 1 and 2, but are equally applicable to other arrangements.

As illustrated, FIG. 6 provides a description of the operation of time to current converter 10 for measuring a timing characteristic of a device under test DUT. Initially, at operation 601, a known signal is coupled to a time to current converter 10. At operation 602, a first current through impedance R1 at an output of the time to current converter IOUT is observed for a number of cycles to establish a first average current Idc. Next, at operation 603, a time varying signal CK is coupled to the time to current converter 10 and an inverted version of the time varying signal to an input of the device under test DUT. At operation 604, an inverted and delayed time varying signal D is received from the device under test DUT. In some embodiments, the device under test DUT may comprise at least one delay element 11 and at least one switch 12 with a corresponding at least one capacitor 13 to provide a capacitance loading to the at least one delay element 11 to amplify the delay associated with the device under test DUT. At operation 605, the process may further comprise logically combining at least the time varying signal CK and the inverted and delayed time varying signal D to obtain a periodic signal of unknown characteristics C. At operation 606, a second current through the impedance R1 caused by the periodic signal of unknown characteristics is observed.

The timing characteristic of the device under test is determined by calculating a ratio of the second current to the first current and multiplying the ratio by the time duration of one clock period of the time varying signal, at operation 607. In certain embodiments, the operation 605 of logically combining the time varying signal and the inverted and delayed time varying signal, may further comprise two sub steps. In operation 605A a first logic gate may receive the time varying signal and the inverted and delayed time varying signal and provide an output corresponding to the overlap time of the time varying signal and the inverted and delayed time varying signal. At operation 605B a second logic gate may receive the output of the first logic gate and a DC input, and provide an output coupled to the impedance.

In some embodiments, the time to current converter described herein may benefit from more of more of the following advantages. In some embodiments, the time to current converter may improve the accuracy of a time delay measurement. In some embodiments, the time to current converter may be used to reduce/remove the impact of process variation and/or reduce/remove the impact of dynamic aging and degradation from power drop within an SoC. In some embodiments, the time to current converter may have a high resolution (pico second level), may occupy a relatively small area within the SoC, may benefit from a simple testing process, may not require a calibration process, and/or may have a wide timing range.

Embodiments described herein may provide a device comprising a device under test and a time to current converter configured to be coupled to the device under test. The device under test may comprise: (i) at least one delay element for creating a delay; (ii) at least one capacitor for providing capacitance loading to the at least one delay element; and (iii) at least one switch to control the capacitance loading provided by the at least one capacitor. The time to current converter may comprise (i) a first input for receiving a first clock signal; (ii) a second input for receiving an inverted and delayed version of the first clock signal from the device under test; and (iii) an impedance module for measuring an output current. During a testing mode, the at least one switch may be in a closed position so the at least one capacitor can provide a capacitance loading to the at least one delay element to amplify the delay associated with the device under test.

Embodiments described herein may provide for a method for measuring a timing characteristic of a device under test comprising coupling a known signal to a time to current converter; and observing a first current through an impedance at an output of the time to current converter for a number of cycles to establish a first average current. The method may further comprise coupling a time varying signal to the time to current converter and an inverted version of the time varying signal to an input of the device under test and receiving an inverted and delayed time varying signal from the device under test, wherein the device under test comprises at least one delay element and at least one switch with a corresponding at least one capacitor to provide a capacitance loading to the at least one delay element to amplify the delay associated with the device under test. The method may further comprise logically combining at least the time varying signal and the inverted and delayed time varying signal to obtain a periodic signal of unknown characteristics; observing a second current through the impedance caused by the periodic signal of unknown characteristics; and determining the timing characteristic of the device under test by calculating a ratio of the second current to the first current and multiplying the ratio by the time duration of one clock period of the time varying signal.

In certain embodiments, the time to current converter may further comprise a first logic gate for receiving the first clock signal and the inverted and delayed version of the first clock signal and having an output corresponding to the overlap time of the first clock signal and the inverted and delayed version of the first clock signal; and a second logic gate for receiving the output of the first logic gate and a DC input, and having an output coupled to the impedance. In certain embodiments, the time to current converter may be implemented as an integrated circuit. In certain embodiments, the time to current converter may be implemented in the same SoC as the device under test. In certain embodiments, the time to current converter may be an aging sensor coupled to a process variation management unit for detecting process variation of the device under test. In certain embodiments, the time to current converter may be an aging sensor coupled to a dynamic aging management unit for detecting aging of the device under test. In certain embodiments, the device under test may operate in a first, normal mode in which the at least one switch is in the open position. In certain embodiments, the device under test may operate in a second, test mode in which the at least one switch is in the closed position. In certain embodiments, the capacitance loading may increase the delay of the device under test by a multiple of 200. In certain embodiments, the at least one switch may be a pass gate switch. In certain embodiments, the at least one capacitor may be a varactor.

In certain embodiments, the step of logically combining the time varying signal and the inverted and delayed time varying signal, may further comprise receiving, by a first logic gate, the time varying signal and the inverted and delayed time varying signal and having an output corresponding to the overlap time of the time varying signal and the inverted and delayed time varying signal; and receiving, by a second logic gate, the output of the first logic gate and a DC input, and having an output coupled to the impedance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device comprising:
    a device under test comprising:
    (i) at least one delay element for creating a delay;
    (ii) at least one capacitor for providing capacitance loading to the at least one delay element; and
    (iii) at least one switch coupled between the at least one capacitor and the at least one delay element to control the capacitance loading provided by the at least one capacitor; and
    a time to current converter configured to be coupled to the device under test, the time to current converter comprising:
    (i) a first input for receiving a first clock signal;
    (ii) a second input for receiving an inverted and delayed version of the first clock signal from the device under test; and
    (iii) an impedance module for measuring an output current;
    wherein during a testing mode, the at least one switch is in a closed position so the at least one capacitor can provide a capacitance loading to the at least one delay element to amplify the delay associated with the device under test.

2. The device of claim 1, wherein the time to current converter further comprises:
    a first logic gate for receiving the first clock signal and the inverted and delayed version of the first clock signal and having an output corresponding to the overlap time of the first clock signal and the inverted and delayed version of the first clock signal; and
    a second logic gate for receiving the output of the first logic gate and a DC input, and having an output coupled to the impedance.

3. The device of claim 1, wherein the time to current converter is implemented as an integrated circuit.

4. The device of claim 1, wherein the time to current converter is implemented in systems on chip (SoC) as the device under test.

5. The device of claim 1, wherein the time to current converter is an aging sensor coupled to a process variation management unit for detecting process variation of the device under test.

6. The device of claim 1, wherein the time to current converter is an aging sensor coupled to a dynamic aging management unit for detecting aging of the device under test.

7. The device of claim 1, wherein the device under test operates in a first, normal mode in which the at least one switch is in the open position.

8. The device of claim 1, wherein the device under test operates in a second, test mode in which the at least one switch is in the closed position.

9. The device of claim 1, wherein the capacitance loading increases the delay of the device under test by a multiple of 200.

10. The device of claim 1, wherein the at least one switch is a pass gate switch.

11. The device of claim 1, wherein the at least one capacitor is a varactor.

12. A method for measuring a timing characteristic of a device under test, the method comprising:
    coupling a known signal to a time to current converter using the time to current converter is an aging sensor;
    observing a first current through an impedance at an output of the time to current converter for a number of cycles to establish a first average current;
    coupling a time varying signal to the time to current converter and an inverted version of the time varying signal to an input of the device under test;
    receiving an inverted and delayed time varying signal from the device under test, wherein the device under test comprises at least one delay element and at least one switch with a corresponding at least one capacitor to provide a capacitance loading to the at least one delay element to amplify the delay associated with the device under test, the at least one switch coupled between the at least one capacitor and the at least one delay element;
    logically combining at least the time varying signal and the inverted and delayed time varying signal to obtain a periodic signal of unknown characteristics;
    observing a second current through the impedance caused by the periodic signal of unknown characteristics; and
    determining the timing characteristic of the device under test by calculating a ratio of the second current to the first current and multiplying the ratio by the time duration of one clock period of the time varying signal;
    wherein the time to current converter is used as an aging sensor coupled to detect at least one of process variation and aging of the device under test.

13. The method of claim 12, wherein the step of logically combining the time varying signal and the inverted and delayed time varying signal, further comprises:
    receiving, by a first logic gate, the time varying signal and the inverted and delayed time varying signal and having an output corresponding to the overlap time of the time varying signal and the inverted and delayed time varying signal; and receiving, by a second logic gate, the output of the first logic gate and a DC input, and having an output coupled to the impedance.

14. The method of claim 12, wherein the method further comprises using the time to current converter is an aging sensor coupled to detect process variation of the device under test.

15. The method of claim 12, wherein the method further comprises using the time to current converter is an aging sensor coupled to detect aging of the device under test.

16. The method of claim 12, wherein the device under test operates in a first, normal mode in which the at least one switch is in the open position.

17. The method of claim 12, wherein the device under test operates in a second, test mode in which the at least one switch is in the closed position.

18. The method of claim 12, wherein the capacitance loading increases the delay of the device under test by a multiple of 200.

19. The method of claim 12, wherein the at least one switch is a pass gate switch.

20. The method of claim 12, wherein the at least one capacitor is a varactor.

* * * * *